US011644504B2

(12) United States Patent
Dondini et al.

(10) Patent No.: US 11,644,504 B2
(45) Date of Patent: May 9, 2023

(54) SYSTEM AND METHOD FOR SELECTING A CLOCK

(71) Applicant: STMicroelectronics S.r.l., Agrate Brianza (IT)

(72) Inventors: Mirko Dondini, Catania (IT); Daniele Mangano, San Gregorio di Cata (IT); Salvatore Pisasale, San Gregorio di Cata (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 288 days.

(21) Appl. No.: 16/791,020

(22) Filed: Feb. 14, 2020

(65) Prior Publication Data

US 2020/0278393 A1 Sep. 3, 2020

(30) Foreign Application Priority Data

Feb. 28, 2019 (IT) .......................... 102019000002967

(51) Int. Cl.
*G01R 31/3185* (2006.01)
*G01R 29/027* (2006.01)
*G01R 31/319* (2006.01)
*G06F 1/08* (2006.01)
*G06F 1/12* (2006.01)
*G06F 13/24* (2006.01)

(52) U.S. Cl.
CPC .. *G01R 31/318552* (2013.01); *G01R 29/0273* (2013.01); *G01R 31/31922* (2013.01); *G01R 31/318594* (2013.01); *G06F 1/08* (2013.01); *G06F 1/12* (2013.01); *G06F 13/24* (2013.01)

(58) Field of Classification Search
CPC ........ G01R 31/318552; G01R 29/0273; G01R 31/318594; G01R 31/31922; G06F 1/08; G06F 1/12; G06F 13/24; G06F 11/1604; G06F 1/04; G06F 1/10; H03L 7/0992; H03L 7/18; G05B 19/042; G05B 2219/25039; G05B 2219/25257
USPC .......................................................... 714/731
See application file for complete search history.

(56) References Cited

U.S. PATENT DOCUMENTS

| | | | | |
|---|---|---|---|---|
| 6,078,225 A | * | 6/2000 | Bontekoe | G06F 1/04 327/144 |
| 7,173,495 B1 | * | 2/2007 | Kenny | G06F 11/1604 327/20 |
| 7,296,170 B1 | * | 11/2007 | Richmond | G06F 1/04 327/144 |
| 2007/0096782 A1 | * | 5/2007 | Ngo | H03L 7/18 327/156 |

(Continued)

*Primary Examiner* — James C Kerveros
(74) *Attorney, Agent, or Firm* — Slater Matsil, LLP

(57) ABSTRACT

In accordance with an embodiment, a system includes an oscillator equipped circuit having an oscillator control circuit configured to be coupled to an external oscillator and a processing unit comprising a clock controller. The clock controller includes an interface circuit configured to exchange handshake signals with the oscillator control circuit, a security circuit configured to receive the external oscillator clock signal and configured to select the external oscillator clock signal as the system clock, and a detection block configured to detect a failure in the external oscillator clock signal. Upon detection of the failure, a different clock signal is selected as the system clock and the interface circuit to interrupts a propagation of the external oscillator.

18 Claims, 4 Drawing Sheets

(56) References Cited

U.S. PATENT DOCUMENTS

2009/0150706 A1  6/2009  Oh et al.

* cited by examiner

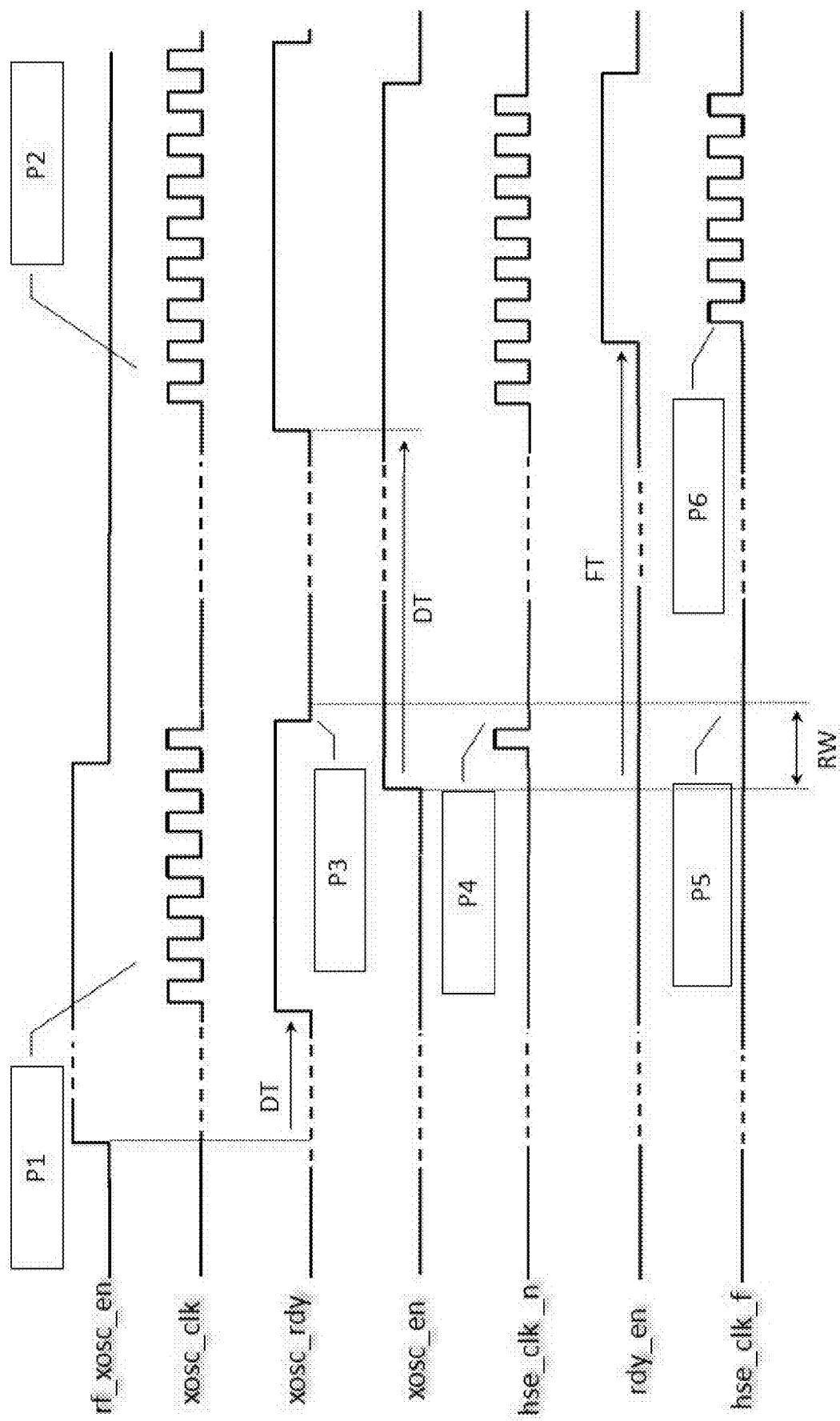

SYSTEM AND METHOD FOR SELECTING A CLOCK

CROSS-REFERENCE TO RELATED APPLICATIONS

This application claims priority to Italian Patent Application No. 102019000002967, filed on Feb. 28, 2019, which application is hereby incorporated herein by reference.

TECHNICAL FIELD

The description generally relates to a processing system and a corresponding apparatus and method, and more specifically relates to a system and method for selecting a clock.

BACKGROUND

Various emerging application scenarios, such as the Internet of Things (IoT) or the automotive area have fostered increased interest for microcontroller base applications with radio frequency capability.

A certain degree of integration between microcontrollers and radio frequency (RF) circuits, in particular third party Intellectual Property cores for radio frequency transceiving, is thus desirable also for general purpose products such as consumer products (e.g. home appliances such as TV screens, refrigerators, washing machines and so on) employing microcontrollers in order to ensure proper handling of these aspects. An increased attention is thus paid to sharing functions between such RF circuits, in particular RF intellectual property (IP) cores and general purpose microcontrollers or Systems-on-Chip (SoC's).

In processing units for general purpose application, such as microcontrollers or System-On-Chip (SoC), like the STM32 microcontroller, crystal oscillators, either placed internally on the microcontroller chip or externally, are used for stable and accurate frequency generation. When the crystal oscillator is external, in particular embedded in a third party IP such as a RF transceiver circuit there is the need to share the crystal oscillator coupled to the RF transceiver circuit. However coupling the oscillator signal from RF transceiver circuit to the microcontroller for use as external oscillator clock signal may present problems in terms of micro-controller safe and stable execution in case of failure or in case of concurrent use of the resource between the RF transceiver circuit and the microcontroller, resulting in races which should be avoided.

SUMMARY

In accordance with an embodiment, a system includes an oscillator equipped circuit comprising an oscillator control circuit configured to be coupled to an external oscillator, the oscillator control circuit configured to cause the external oscillator to provide an external oscillator clock signal to the oscillator equipped circuit; and a processing unit comprising a clock controller configured to manage clock signals to select a system clock for the processing unit. The clock controller is coupled to the oscillator control circuit to receive the external oscillator clock signal and it is configured to selectably provide the external oscillator clock signal as the system clock, and the clock controller includes an interface circuit configured to exchange handshake signals with the oscillator control circuit to enable propagation of the external oscillator clock signal to the clock controller; a security circuit configured to receive the external oscillator clock signal and configured to select the external oscillator clock signal as the system clock; and a detection block configured to detect a failure in the external oscillator clock signal and, upon detection of the failure, issue a failure signal indicating the failure, wherein the security circuit, upon the issuance of the failure signal, is configured to select a different clock signal as the system clock and cause the interface circuit to interrupt a propagation of the external oscillator clock signal to the clock controller.

In accordance with another embodiment, a method includes receiving an external oscillator clock signal from an oscillator equipped circuit and selectably providing the external oscillator clock signal as a system clock; exchanging handshake signals between a clock controller and the oscillator equipped circuit to enable propagation of the external oscillator clock signal to the clock controller; receiving the external oscillator clock signal; detecting a failure in the received external oscillator clock signal; issuing a failure signal in response to detecting the failure; and upon the issuance of the failure signal, selecting a different clock signal as the system clock, and operating on the handshake signals to interrupt propagation of the external oscillator clock signal to the clock controller.

In accordance with a further embodiment, a system, includes: a clock detection circuit having a clock input configured to be coupled to an external clock source, the clock detection circuit configured to determine a presence of an external clock signal at the clock input and assert an external clock presence signal when the external clock signal is present; a clock interface circuit having a clock ready input configured to be coupled to a clock ready output of the external clock source, the clock interface circuit comprising a ready filter configured to assert a ready enable signal when both the external clock signal is active and an external clock ready signal is asserted at the clock ready input for a first predetermined period of time; an interrupt generation circuit configured to generate an external clock failure interrupt signal when the external clock presence signal is de-asserted; and a clock selection circuit configured to provide the external clock signal to a system clock output when the external clock presence signal and the external clock ready signal are both asserted, and to provide a different clock signal to the system clock output when the external clock presence signal is de-asserted.

In accordance with a further embodiment, a method includes detecting a presence of an external clock signal and an external clock ready signal indicating an availability of the external clock signal from an external clock generator; asserting an ready enable signal when the both the external clock ready signal and the external clock signal is present for a first predetermined period of time; routing the external clock signal to a system clock output upon assertion of the ready enable signal; asserting an external clock fail signal when the presence of the external clock signal is no longer detected; and routing a different clock signal to the system clock output and asserting an external clock failure interrupt signal when the external clock fail signal is asserted.

BRIEF DESCRIPTION OF THE DRAWINGS

One or more embodiments will now be described, by way of example only, with reference to the annexed figures, wherein:

FIG. 4 is exemplary of timing diagrams of the signals shown in FIG. 3.

DETAILED DESCRIPTION OF ILLUSTRATIVE EMBODIMENTS

In the ensuing description, one or more specific details are illustrated, aimed at providing an in-depth understanding of examples of embodiments of this description. The embodiments may be obtained without one or more of the specific details, or with other methods, components, materials, etc. In other cases, known structures, materials, or operations are not illustrated or described in detail so that certain aspects of embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment" or "in one embodiment" that may be present in one or more points of the present description do not necessarily refer to one and the same embodiment. Moreover, particular conformations, structures, or characteristics may be combined in any adequate way in one or more embodiments.

The references used herein are provided merely for convenience and hence do not define the extent of protection or the scope of the embodiments.

Embodiments relate to a processing system and a corresponding apparatus and method. Systems may include a processing unit, and a further circuit comprising an oscillator control circuit coupled to an external oscillator. The oscillator control circuit is configured to control the external oscillator to provide an external oscillator clock signal to the further circuit, and the processing unit including a clock controller configured to manage clock signals to select a system clock for the processing unit.

One or more embodiments may be applied to system comprising microcontrollers or System-on-Chip (SoC) arrangements for general purpose applications operating in association with radio frequency transceivers, in particular for long range (LoRa) applications.

One or more embodiments may relate to a corresponding apparatus (e.g. a consumer product such as a microcontroller-based consumer product such as a home appliance) and a corresponding method. Some embodiments advantageously provide safe and stable execution and avoid problems in the case of concurrent use of a shared clock signal. One or more embodiments provide improved system robustness while maintaining performance for application under execution. One or more embodiments provide maximized resource sharing, and avoid duplication of control logic, such as a temporization counter.

Figure 1:
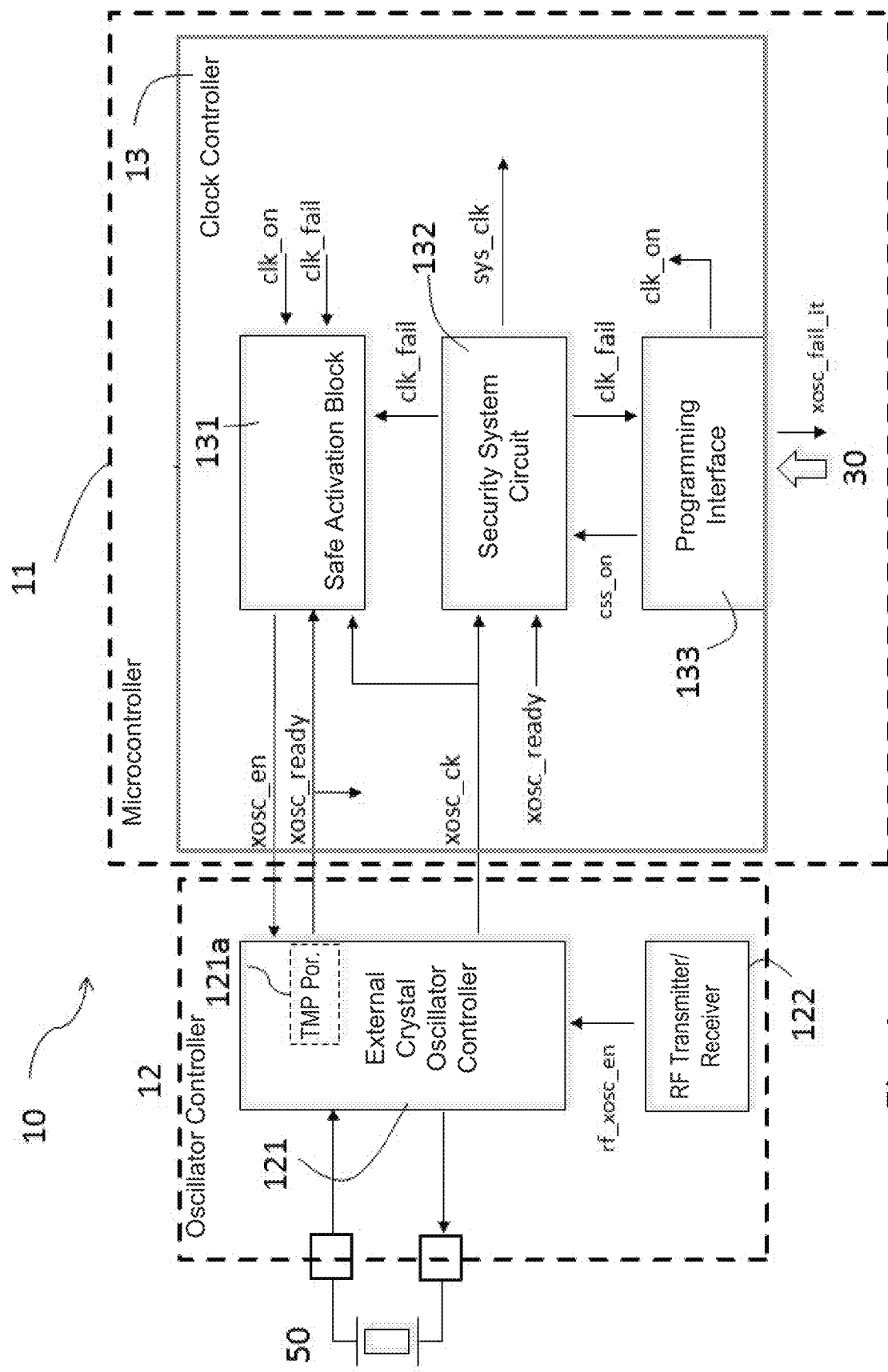
FIG. 1 is a block diagram exemplary of a system including a processing unit and a further circuit coupled to a crystal oscillator.

FIG. 1 illustrates a system 10 for sharing an oscillator clock signal between a processing unit and an oscillator equipped circuit. The system 10 includes a circuit 12 coupled to a crystal oscillator 50, which is here defined as oscillator equipped circuit. The crystal oscillator 50 is preferably external to the circuit 12. In the example here, the circuit 12 is a RF transceiver for a LoRa application such as the Semtech SX1262. The system 10 includes a processing unit 11, in particular a general purpose application microcontroller 11 which is here only partially represented by means of a clock controller 13 included in the microcontroller 11 for the purpose of selecting a system clock system_clk to be propagated to the core of the microcontroller 11, e.g. a Central Processing Unit 30. Such general purpose application microcontroller 111 may be embodied by the STM32 general purpose microcontroller. In general the oscillator equipped circuit 12 may be an Intellectual Property of a third party with respect to the IP of the general purpose microcontroller 11.

Preferably the oscillator equipped circuit 12 and the general purpose application microcontroller 11 may be arranged on a same support for circuits, in particular a same PCB (printed circuit board) on which thus the system 10 is arranged.

The oscillator equipped circuit 12 includes an external crystal oscillator controller 121, which is coupled to an external crystal oscillator 50. The oscillator equipped circuit 12, includes a RF transmitter/receiver 122, which is configured to issue an external oscillator enable signal rf_xosc_en to the external crystal oscillator controller 121 to enable use of the external crystal oscillator 50 as clock signal for oscillator equipped circuit 12.

The clock controller 13 is configured to interact with the crystal oscillator source, i.e. external crystal oscillator controller 121, which controls the oscillator 50, through a safe activation block 131, which implements a handshake control interface 131. The a safe activation block 131 supplies an enable signal xosc_en to the external crystal oscillator controller 121 and receives in turn, from a temporization portion 121a, that may include a temporization counter, a ready signal, xosc_ready.

The external crystal oscillator controller 121 is coupled to the crystal oscillator 50 to generate an external oscillator clock signal xosc_clk. The signal xosc_clk is the output from the crystal oscillator after temporization time has elapsed. The clock controller 13 then includes a security system circuit 132, receiving the external oscillator clock signal xosc_clk, and also the external oscillator ready signal xosc_ready and configured to select such signal as system clock sys_clk.

The security system circuit 132 receives also a security enable signal css_on to activate such security system circuit 132 from a programming interface 133 of the clock controller 13, which includes programming registers and operates under the control of commands issued by the CPU 30.

The security system circuit 132 is configured to issue a failure signal clk_fail, signaling if there is a failure in the external oscillator clock signal xosc_clk. Such a failure signal clk_fail is issued to the safe activation block 131 and to the programming interface 133, which forwards a corresponding interrupt xosc_fail_it toward the CPU 30.

The programming interface 133 is configured to generate a clock activation signal clk_on for the safe activation block 131 signaling to such circuit to enable use of the external crystal oscillator 50 through the handshake control signals xosc_en, xosc_rd.

Figure 2:
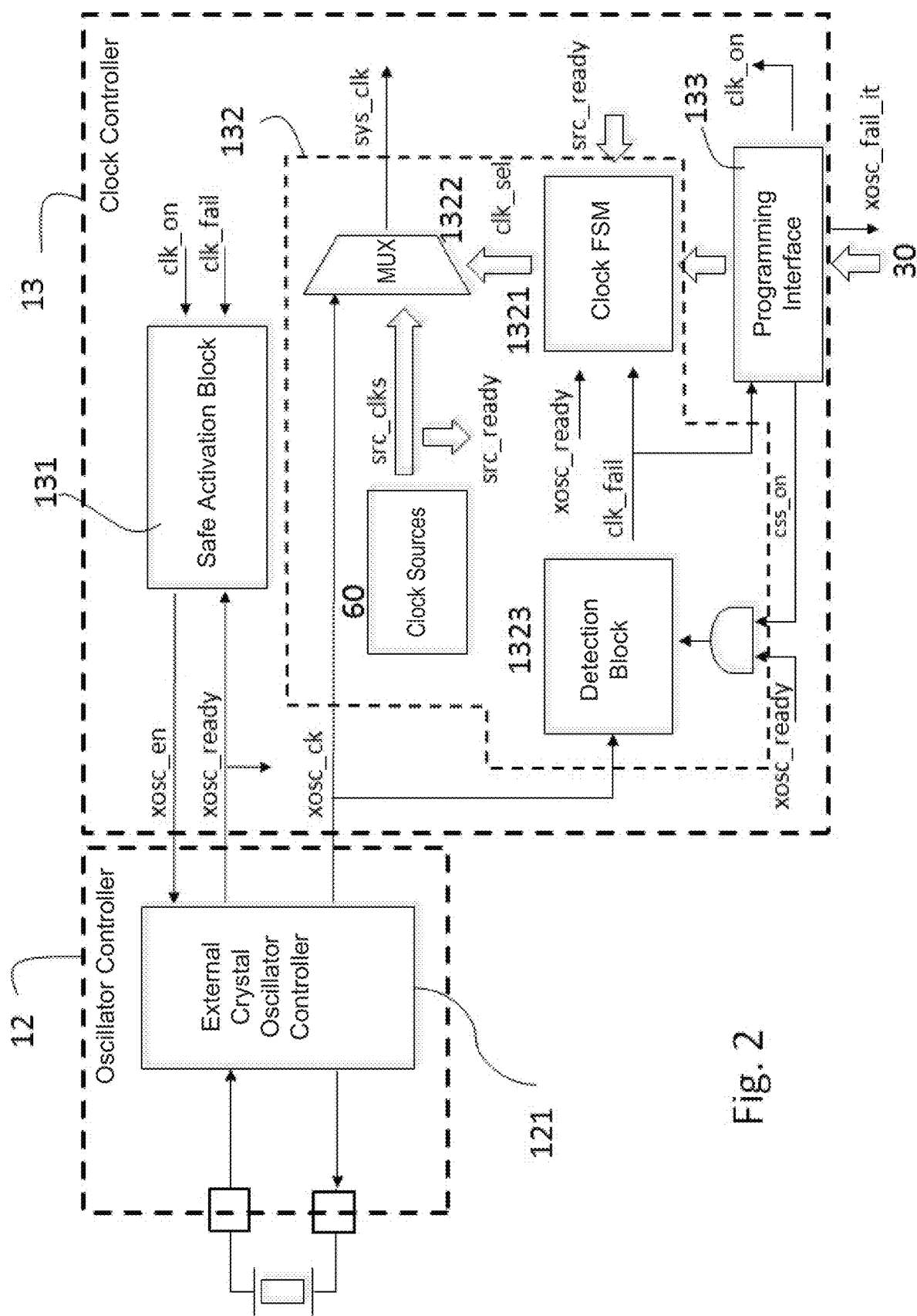
FIG. 2 is exemplary of a secure system circuit implementation in one or more embodiments.

In FIG. 2 portions of the same system 10 are schematically represented detailing the block and circuits relevant for the security system circuit 131.

In various embodiments, safe activation block 131 operates as control interface for handshake control signals to enable operation of the external crystal oscillator 50, receives the clock activation signal clk_on from the programming interface 131 under the control of the CPU 30, to activate the oscillator 50, and receives the detected failure a clk_fail signal to deactivate the oscillator 50.

The security system circuit 132 includes a clock Finite State Machine 1321 which is the control logic of the clock controller 13, operating under the control of commands issued by the programming interface 133 in its turn under the control of the CPU 30. The security system circuit 132 includes a selection block 1322, in particular a multiplexer, which receives the external oscillator clock signal xosc_ck at one input and at its other inputs other clock signals src_clks, from clock sources 6o, in general oscillators internal to the microcontroller 11, although they may not be specifically placed inside the security system circuit 132, which may be simply coupled to them. The clock Finite State Machine 1321 issues a selection signal clk_sel to the selection block 1322 to select the system clock signal sys_clk among the input clock signals including the oscillator clock signal xosc_clk and the other clock signals src_clks. A source ready src_ready signal supplied to the clock Finite State Machine 1321 indicates which of the other clock signals src_clks is stable and ready for use. In particular, there is a source ready signal for each clock source in order to inform clock controller about the availability of the selectable source.

The security system circuit 132 includes then a detection block 1323 which is configured to detect a failure in the external oscillator clock signal xosc_ck and issue the failure signal clk_fail to the clock Finite State Machine 1321 and programming interface 133.

The detection block 1323 is enabled by the security activation signal css_on and external oscillator ready signal xosc_ready, which should be both true (a logic AND is shown) to enable operation of the detection block 1323, which is then operating only if the external oscillator 50 is in use and the security function is requested by the CPU 30.

In case of failure detection by the detection block 1323, the failure signal clk_fail issued to the clock Finite State Machine 1321 determines that the clock Finite State Machine 1321 switches through the selection signal sel_clk the system clock sys_clk to a stable clock source among the other clock signals src_clks. The security system circuit 132 is then configured to switch off the external oscillator clock signal xosc_ck upon reception by detection block 1323 of the failure signal clk_fail. The programming interface 133 is also configured to raise an interrupt xosc_fail_it upon reception of the failure signal clk_fail from the detection block 1323.

Figure 3:
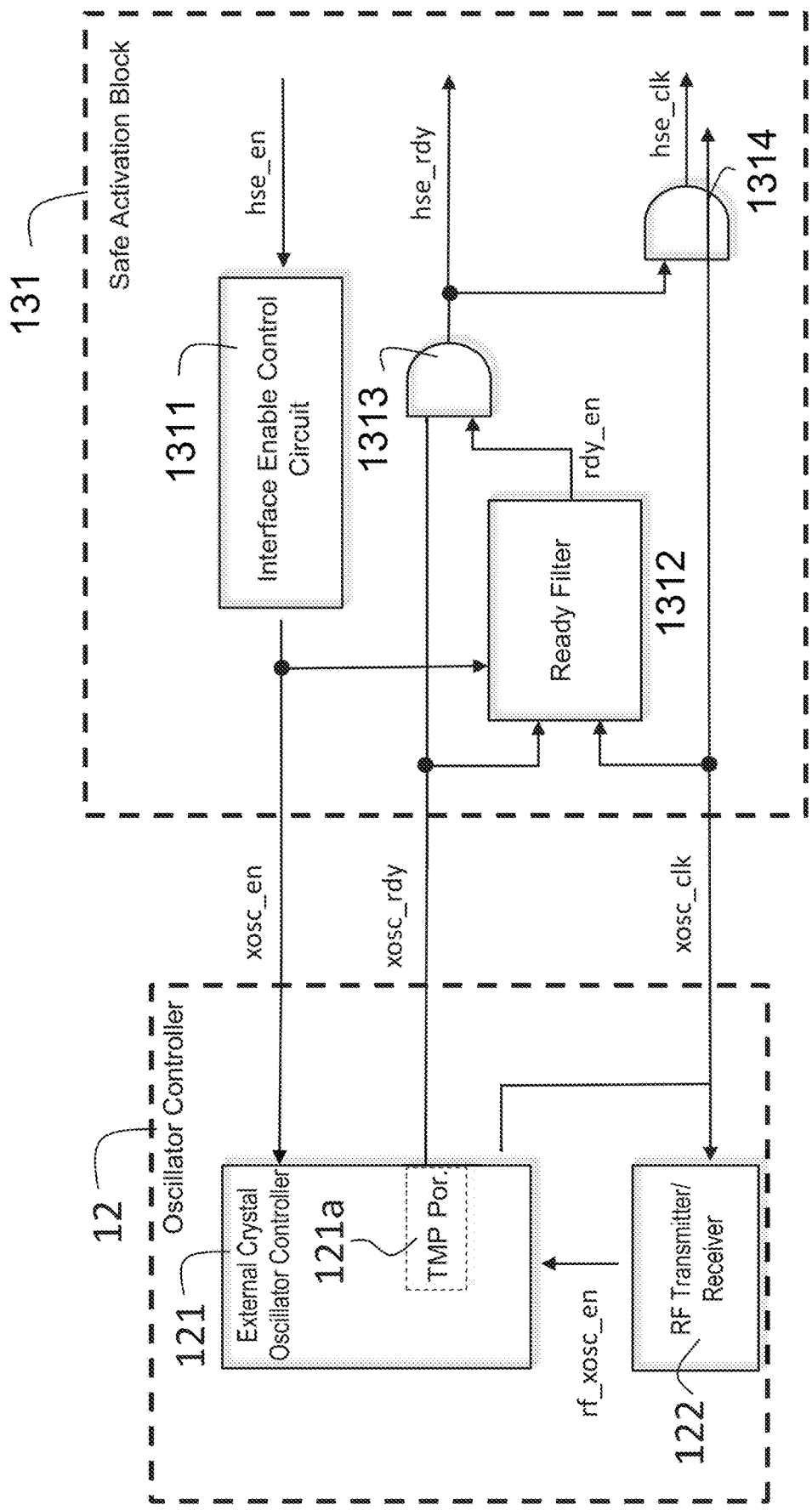
FIG. 3 is exemplary of a control interface circuit implementation in one or more embodiments.

In FIG. 3 the same system 10 is represented detailing the block and circuits relevant for a temporal filtering function of the Xosc_ready signal implemented by the safe activation block 131. The safe activation block 131 is a handshake interface, as mentioned, which allows controlling the sharing of the external oscillator clocks between circuits 11 and 12. The safe activation block also includes an implementation of a temporal filtering function, to avoid glitches which may be generated by the contention of the clock signal by the circuits 11 and 12. Thus, the Clock Controller 13 by the block 131 implements a configurable/programmable filtering mechanism on Xosc ready control signal to cope with enable control latency inside the oscillator equipped circuit 12, that could lead to spurious glitches on ready signal.

The safe activation block 131 thus includes an interface enable control circuit 1311, which receives an external oscillator enable signal hse_en, which may correspond to the clk_on signal of FIG. 1, and issues the external oscillator enable signal xosc_en signal to the oscillator equipped circuit 12, as described, for the handshake protocol, and also to a ready filter 1312, which also receives the external oscillator ready signal xosc_ready and the external oscillator clock signal xosc_clk signal. The ready filter 1312 is configured to issue a ready enable rdy_en signal on the basis of the values of the handshake signals and of the external oscillator clock signal xosc_clk signal.

The ready enable rdy_en signal is thus issued as output by the ready filter 1312, which changes state, e.g. goes to high logic level, after the time window is passed, and it is used to perform a gating of the external oscillator ready signal xosc_rdy, in particular by bringing both the signals as input to an AND gate 1313, producing a microcontroller gated ready signal hse_rdy. Then the clock signal Xosc_clk is gated in its turn with the microcontroller gated ready signal hse_rdy, in particular by a further AND gate 1314, so that a microcontroller external oscillator clock signal hse_clk is obtained, which take in accounts timing latency of xosc_en signal inside the oscillator equipped circuit 12 and may be free of spurious glitches or other effects generated by the racing.

In FIG. 4 timing diagrams of the signals shown in FIG. 3 are represented. For example, hse-clock_n represents an unfiltered version of the external oscillator clock signal hse_clock; P1 represents a time instant in which the signal xosc_clock is enabled by circuit 12; P2 represents a time instant in which the signal xosc_clock is enabled by the microcontroller 11; P3 represents a time instant in which the xosc_ready signal is falling while signal xosc_en is high; P4 represents a time instant in which the hse_clock signal is lost while the signal xosc_en is high; P5 represents a time instant in which the hse_clock, i.e. the filtered hse clock signal, is kept low during the transition window; and P6 represents a time instant in which the hse_clock signal is propagated after filtering expiration.

DT indicates a delay time needed to switch on xosc_clock by the Xosc controller 121 of RF IP 12, which is the time computed by its internal temporization counter 121a. RW indicates a race window in which there is control race risk, and FT indicates a filtered time interval for the rdy_en signal, in which such rdy_en signal stays in the low logic state.

From FIG. 4 it can be observed that in case of attempt of control of the external oscillator 50 both from the circuit 12 and the microcontroller 11, with potential race risk, the block 131 is configured to ensure that the external oscillator clock signal xosc_ck is propagated, as microcontroller external clock hse_clk, to the core of the microcontroller 11 only after a time filtering window, e.g. a given time interval.

The ready filter 1312 is configured or programmed with the delay time DT, which is sized to cover only the time window where risk of clock loss or glitch could occur, e.g. window RW. After this time, which is much smaller than the delay time DT, has elapsed, the ready filter 1312 generates the ready enable rdy_en signal that allow propagation of the external oscillator ready signal xosc_rdy to the microcontroller clock ready signal hse_rdy through the AND gate 1313. If the external oscillator ready signal xosc_rdy y is asserted (xosc_clk is on), the external oscillator clock signal xosc_ck is propagated to the microcontroller external clock hse_clk through AND gate 1314 after the time window RW has been overtaken; if the external oscillator ready signal xosc_rdy is low (xosc_clk has been switched off by the controller 121 of the external oscillator of the circuit 12, which is the case described by the timing diagram) the external oscillator clock signal xosc_ck is propagated to the microcontroller external clock hse_clk of the microcontroller 11 after a delay time DT, time needed and counted through respective temporization block 121a by the oscillator controller 12 to switch on again the external oscillator clock signal xosc_ck, as consequence of xosc_en request coming from the micro-controller 12.

Thus the ready filter 1312 asserts an rdy_en signal, after the filtered time FT, that allows the propagation of the ready signal xosc_rdy from the oscillator equipped circuit 12.

It will be appreciated that the embodiments are not limited to application in the context of microcontrollers (e.g. STM32 microcontroller) applications with embedded RF IP for IoT (e.g. SW1262 Semtech) for LoRa applications, e.g. for multi-purpose microprocessor-based consumer applications such as home appliances and the like.

One or more embodiments may thus provide a system, including: a processing unit (e.g. r a general purpose microcontroller such a STM32 or a System-on-Chip or a subsystem thereof), a circuit (e.g. the RF transceiver circuit 12) comprising an oscillator control circuit coupled to an external oscillator, such oscillator control circuit being configured to control the external oscillator to provide an external oscillator clock signal to circuit coupled to the oscillator, the processing unit including a clock controller configured to manage clock signals, e.g. which may be externally or internally generated, to select a system clock for the processing unit, e.g. the HSE clock signal of the STM32 microcontroller, wherein: such clock controller is coupled to the oscillator control circuit to receive the external oscillator clock signal and it is configured to selectably provide such external oscillator clock signal as system clock, as mentioned for instance as HSE clock signal, the clock controller comprising an interface circuit, configured to exchange handshake signals, e.g. enable signal xosc_en and ready signal xosc_ready, with the oscillator control circuit, in particular with the temporization counter of the RF circuit, to enable propagation of the external oscillator clock signal to the clock controller, and a security circuit, which includes receiving the external oscillator clock signal and configured to select such signal as system clock under the control of a detection block (e.g. block 1313) which is configured to detect a failure in the external oscillator clock signal and, upon detection of the failure, issuing a failure signal manifesting the failure, such security circuit upon the issuance of the failure signal being configured to select as system clock a different clock signal, e.g. selected among signal src_clks, and operate on the interface circuit to interrupt propagation of the external oscillator clock signal to the clock controller.

In one or more embodiments the clock controller may be configured to raise an interrupt xosc_fail_it to the processing unit core, e.g. CPU 30, upon issuance of the failure signal from the detection block.

In one or more embodiments the interface block may include gating circuitry, e.g. circuits 1311, 1312, 1313, 1314, configured to perform a gating of the ready signal of the handshake signals with a time filtering window to enable propagation of the external oscillator clock signal as system clock.

In one or more embodiments, the circuit coupled to the oscillator may include a radio frequency transceiver.

In one or more embodiments, the security circuit includes a control logic, in particular a finite state machine (which e.g. can be the control logic of the clock controller already provided in the microcontroller to select the system clock signal), operating under the control of a central processing unit of the processing unit, configured to select such signal as system clock on the basis of the failure signal and to, upon the issuance of the failure signal, select as system clock a different clock signals and operate on the interface circuit to interrupt propagation of the external oscillator clock signal to the clock controller.

In various embodiments, the circuits described herein may be implemented using logic circuits known in the art.

In one or more embodiments the apparatus (e.g. a micro-controller-based appliance) may include a processor circuit, e.g. CPU 30, receiving an external clock external oscillator clock signal by means of a system according to one or more embodiments.

A method of operation of a system according to one or more embodiments may include: receiving the external oscillator clock signal from the oscillator equipped circuit and selectably providing the external oscillator clock signal as system clock, exchanging handshake signals between the clock controller and the oscillator control circuit to enable propagation of the external oscillator clock signal to the clock controller, and receiving the external oscillator clock signal and selecting the external oscillator clock signal as system clock under the control of a failure detection operation in the external oscillator clock signal which, upon detection of the failure, issues a failure signal manifesting the failure, selecting upon the issuance of the failure signal as system clock a different clock signal and operating on the handshake signals to interrupt propagation of the external oscillator clock signal to the clock controller.

In one or more embodiments, the method may include raising an interrupt to the processing circuit core upon issuance of the failure signal.

In one or more embodiments, the method may include performing a gating of the ready signal of the handshake signals with a time filtering window to enable propagation of the external oscillator clock signal as system clock.

Without prejudice to the underlying principles, the details and embodiments may vary, even significantly, with respect to what has been described, by way of example only, without departing from the extent of protection.

What is claimed is:
1. A system, including:
an oscillator equipped circuit comprising an oscillator control circuit configured to couple to an external oscillator, the oscillator control circuit configured to cause the external oscillator to provide an external oscillator clock signal to the oscillator equipped circuit; and
a processing unit comprising a clock controller configured to manage clock signals to select a system clock for the processing unit, wherein
the clock controller is coupled to the oscillator control circuit to receive the external oscillator clock signal and it is configured to selectively provide the external oscillator clock signal as the system clock, the clock controller comprising
an interface circuit comprising:
an interface enable control circuit configured to:
receive a clock activation signal,
upon receipt of the clock activation signal, exchange handshake signals with the oscillator control circuit by transmitting an oscillator enable signal to the oscillator control circuit, and receiving the external oscillator clock signal and an external oscillator ready signal in response to transmitting the oscillator enable signal, wherein the external oscillator ready signal is a static signal indicating an availability of the external oscillator clock signal from the external oscillator, and the external oscillator clock signal is a switching signal separate from the external oscillator ready signal, and gating circuitry configured to gate the external oscillator ready signal and the external oscillator clock signal after the external oscillator ready signal and the external oscillator clock signal has been active for a predetermined period of time, wherein the predetermined period of time is at least one full clock cycle of the external oscillator clock signal, a security circuit configured to receive the gated external oscillator clock signal and configured to select the gated external oscillator clock signal as the system clock, and a detection block configured to detect a failure in the external oscillator clock signal and, upon detection of the failure, issue a failure signal indicating the failure, wherein the security circuit, upon an issuance of the failure signal, is configured to select a different clock signal as the system clock and cause the interface circuit to interrupt a propagation of the external oscillator clock signal to the clock controller.

2. The system of claim 1, wherein the clock controller is configured to assert an interrupt upon the issuance of the failure signal from the detection block to a processor.

3. The system of claim 1, wherein the oscillator equipped circuit comprises a radio frequency transceiver.

4. The system of claim 1, wherein the security circuit includes a finite state machine, operating under control of a central processor of the processing unit, the finite state machine configured to select the system clock based on the failure signal and to, upon the issuance of the failure signal, select as the system clock the different clock signal, and cause the interface circuit to interrupt propagation of the external oscillator clock signal to the clock controller.

5. The system of claim 1, further wherein the processing unit further comprises a processor having a clock input configured to receive the external oscillator clock signal.

6. The system of claim 5, wherein the processor comprises a general purpose microcontroller or a system-on-a-chip.

7. A method comprising:
exchanging handshake signals between a clock controller and an oscillator equipped circuit to enable propagation of an external oscillator clock signal to the clock controller, exchanging the handshake signals comprising
transmitting an oscillator enable signal from the clock controller to an oscillator equipped circuit,
in response to transmitting the oscillator enable signal, receiving the external oscillator clock signal and an external oscillator ready signal from the oscillator equipped circuit, wherein the external oscillator ready signal is a static signal indicating an availability of the external oscillator clock signal from the oscillator equipped circuit, and the external oscillator clock signal is a switching signal separate from the external oscillator ready signal,
gating the external oscillator ready signal and the external oscillator clock signal after the external oscillator ready signal and the external oscillator clock signal both have been active for a predetermined period of time, wherein the predetermined period of time is at least one full clock cycle of the external oscillator clock signal;
selecting the gated external oscillator clock signal as a system clock;
detecting a failure in the received external oscillator clock signal;
issuing a failure signal in response to detecting the failure; and upon an issuance of the failure signal, selecting a different clock signal as the system clock, and operating on the handshake signals to interrupt propagation of the external oscillator clock signal to the clock controller.

8. The method of claim 7, including asserting an interrupt to a processing circuit core upon the issuance of the failure signal.

9. A system, comprising:
a clock interface circuit having a clock ready input configured to couple to a clock ready output and an external clock output of an external clock source, the clock interface circuit comprising a ready filter configured to assert a ready enable signal in response to both an external clock signal produced by the external clock source at the external clock ready output being active and an external clock presence signal produced by the external clock source being asserted for a first predetermined period of time, wherein the first predetermined period of time is at least one full clock cycle of the external clock signal, the external clock presence signal and the ready enable signal are static signals and the external clock signal is a switching signal separate from the external clock presence signal and the external clock presence signal;

an interrupt generation circuit configured to generate an external clock failure interrupt signal when the external clock presence signal is de-asserted; and a clock selection circuit configured to provide the external clock signal to a system clock output when the ready enable signal is asserted, and to provide a different clock signal to the system clock output when the external clock presence signal is de-asserted.

10. The system of claim 9, wherein the clock selection circuit comprises:
a finite state machine coupled to the clock interface circuit, the finite state machine configured to generate select output based on the external clock presence signal and the external clock presence signal; and a multiplexer having a first input coupled to the external clock source, a second input coupled to a further clock source providing the different clock signal, and a select input coupled to the select output of the finite state machine.

11. The system of claim 9, further comprising the external clock source, wherein the external clock source comprises an external clock controller configured to couple to an external oscillator, the external clock controller comprising a temporization counter configured to assert the external clock presence signal when an output of the external oscillator is active for a second predetermined period of time.

12. The system of claim 11, wherein the external oscillator comprises a crystal oscillator.

13. The system of claim 11, wherein the external clock source is disposed on a first chip, and the clock interface circuit, the interrupt generation circuit and the clock selection circuit is disposed on a second chip separate from the first chip.

14. The system of claim 13, wherein the first chip comprises a microcontroller having a clock input coupled to the system clock output of the clock selection circuit.

15. The system of claim 13, wherein the second chip comprises an RF transceiver circuit.

16. A method, comprising:
detecting a presence of an external clock signal and an external clock ready signal indicating an availability of the external clock signal from an external clock generator;

asserting a ready enable signal in response to both the external clock ready signal being asserted and the external clock signal being active for a first predetermined period of time, wherein the first predetermined period of time is at least one full clock cycle of the external clock signal, and the external clock ready signal and the ready enable signal are static signals, and the external clock signal is a switching signal separate from the external clock ready signal and the ready enable signal;

routing the external clock signal to a system clock output upon assertion of the ready enable signal;

asserting an external clock fail signal upon detection of a failure in the external clock signal; and routing a different clock signal to the system clock output and asserting an external clock failure interrupt signal when the external clock fail signal is asserted.

17. The method of claim 16, further comprising transmitting an external clock enable signal to the external clock generator.

18. The method of claim 17, further comprising providing the system clock output to a microprocessor.

* * * * *